(12) United States Patent
Brewer et al.

(10) Patent No.: US 7,188,662 B2
(45) Date of Patent: Mar. 13, 2007

(54) APPARATUS AND METHOD OF EFFICIENT FLUID DELIVERY FOR COOLING A HEAT PRODUCING DEVICE

(75) Inventors: Richard Grant Brewer, Newark, CA (US); Girish Upadhya, Cupertino, CA (US); Peng Zhou, Albany, CA (US); Mark McMaster, Menlo Park, CA (US); Paul Tsao, Los Altos, CA (US)

(73) Assignee: Cooligy, Inc., Moutain View, CA (US)

( * ) Notice: Subject to any disclaimer, the term of this patent is extended or adjusted under 35 U.S.C. 154(b) by 40 days.

(21) Appl. No.: 11/049,313

(22) Filed: Feb. 1, 2005

(65) Prior Publication Data

US 2005/0269061 A1    Dec. 8, 2005

Related U.S. Application Data

(60) Provisional application No. 60/577,262, filed on Jun. 4, 2004.

(51) Int. Cl.
*F28D 7/02* (2006.01)
(52) U.S. Cl. ..................... 165/80.4; 165/80.5
(58) Field of Classification Search ............... 165/80.4, 165/80.5, 185; 361/699
See application file for complete search history.

(56) References Cited

U.S. PATENT DOCUMENTS

| 596,062 | A | 12/1897 | Firey |
|---|---|---|---|
| 2,039,593 | A | 5/1936 | Hubbuch et al. |
| 2,273,505 | A | 2/1942 | Florian |
| 3,361,195 | A | 1/1968 | Meyerhoff et al. |
| 3,771,219 | A | 11/1973 | Tuzi et al. |
| 3,817,321 | A | 6/1974 | von Cube et al. |

(Continued)

FOREIGN PATENT DOCUMENTS

CN    97212126.9    3/1997

(Continued)

OTHER PUBLICATIONS

Stephen C. Jacobson et al., "Fused Quartz Substrates for Microchip Electrophoresis", Analytical Chemistry, vol. 67, No. 13, Jul. 1, 1995, pp. 2059-2063.

(Continued)

*Primary Examiner*—Teresa J. Walberg
(74) *Attorney, Agent, or Firm*—Haverstock & Owens LLP

(57) ABSTRACT

A heat exchanger includes features for alleviating high pressure drops and controlling the expansion of fluid during freezing. The heat exchanger includes an interface layer in which heat is transferred from a heat source to a fluid. A manifold layer couples to the interface layer. The manifold layer includes a first set of substantially vertical fluid paths for directing the fluid to the interface layer. The manifold layer further includes a second set of substantially horizontal fluid paths, perpendicular to the first set of fluid paths, for removing the fluid from the interface layer. Preferably, the heat exchanger includes an upper layer for circulating the fluid to and from the manifold layer. The upper layer can include at least one of a plurality of protruding features and a porous structure. Preferably, a porous structure is disposed along the interface layer.

54 Claims, 8 Drawing Sheets

U.S. PATENT DOCUMENTS

| | | |
|---|---|---|
| 3,948,316 A | 4/1976 | Souriau |
| 4,109,707 A | 8/1978 | Wilson et al. |
| 4,203,488 A | 5/1980 | Johnson et al. |
| 4,211,208 A | 7/1980 | Lindner |
| 4,235,285 A | 11/1980 | Johnson et al. |
| 4,312,012 A | 1/1982 | Frieser et al. |
| 4,345,267 A | 8/1982 | Corman et al. |
| 4,450,472 A | 5/1984 | Tuckerman et al. |
| 4,467,861 A | 8/1984 | Kiseev et al. |
| 4,485,429 A | 11/1984 | Mittal |
| 4,494,171 A * | 1/1985 | Bland et al. ............... 361/704 |
| 4,516,632 A | 5/1985 | Swift et al. |
| 4,540,115 A | 9/1985 | Hawrylo |
| 4,561,040 A | 12/1985 | Eastman et al. |
| 4,567,505 A | 1/1986 | Pease et al. |
| 4,573,067 A | 2/1986 | Tuckerman et al. |
| 4,574,876 A | 3/1986 | Aid |
| 4,644,385 A | 2/1987 | Nakanishi et al. |
| 4,716,494 A | 12/1987 | Bright et al. |
| 4,758,926 A | 7/1988 | Herrell et al. |
| 4,866,570 A | 9/1989 | Porter |
| 4,868,712 A | 9/1989 | Woodman |
| 4,893,174 A | 1/1990 | Yamada et al. |
| 4,894,709 A | 1/1990 | Phillips et al. |
| 4,896,719 A | 1/1990 | O'Neill et al. |
| 4,903,761 A | 2/1990 | Cima |
| 4,908,112 A | 3/1990 | Pace |
| 4,938,280 A | 7/1990 | Clark |
| 4,978,638 A | 12/1990 | Buller et al. |
| 5,009,760 A | 4/1991 | Zare et al. |
| 5,016,090 A | 5/1991 | Galyon et al. |
| 5,016,138 A | 5/1991 | Woodman |
| 5,043,797 A | 8/1991 | Lopes |
| 5,057,908 A | 10/1991 | Weber |
| 5,070,040 A | 12/1991 | Pankove |
| 5,083,194 A | 1/1992 | Bartilson |
| 5,088,005 A | 2/1992 | Ciaccio |
| 5,099,311 A | 3/1992 | Bonde et al. |
| 5,099,910 A | 3/1992 | Walpole et al. |
| 5,125,451 A | 6/1992 | Matthews |
| 5,131,233 A | 7/1992 | Cray et al. |
| 5,145,001 A * | 9/1992 | Valenzuela ............... 165/164 |
| 5,161,089 A | 11/1992 | Chu et al. |
| 5,203,401 A | 4/1993 | Hamburgen et al. |
| 5,218,515 A | 6/1993 | Bernhardt |
| 5,228,502 A | 7/1993 | Chu et al. |
| 5,232,047 A | 8/1993 | Matthews |
| 5,239,200 A | 8/1993 | Messina et al. |
| 5,239,443 A | 8/1993 | Fahey et al. |
| 5,263,251 A | 11/1993 | Matthews |
| 5,265,670 A | 11/1993 | Zingher |
| 5,269,372 A | 12/1993 | Chu et al. |
| 5,274,920 A | 1/1994 | Matthews |
| 5,275,237 A | 1/1994 | Rolfson et al. |
| 5,308,429 A | 5/1994 | Bradley |
| 5,309,319 A | 5/1994 | Messina |
| 5,310,440 A | 5/1994 | Zingher |
| 5,316,077 A | 5/1994 | Reichard |
| 5,317,805 A | 6/1994 | Hoopman et al. |
| 5,325,265 A | 6/1994 | Turlik et al. |
| 5,346,000 A | 9/1994 | Schlitt |
| 5,380,956 A | 1/1995 | Loo et al. |
| 5,383,340 A | 1/1995 | Larson et al. |
| 5,386,143 A | 1/1995 | Fitch |
| 5,388,635 A | 2/1995 | Gruber et al. |
| 5,397,919 A | 3/1995 | Tata et al. |
| 5,421,943 A | 6/1995 | Tam et al. |
| 5,427,174 A | 6/1995 | Lomolino, Sr. et al. |
| 5,436,793 A | 7/1995 | Sanwo et al. |
| 5,459,099 A | 10/1995 | Hsu |
| 5,490,117 A | 2/1996 | Oda et al. |
| 5,508,234 A | 4/1996 | Dusablon, Sr. et al. |
| 5,514,832 A | 5/1996 | Dusablon, Sr. et al. |
| 5,514,906 A | 5/1996 | Love et al. |
| 5,544,696 A | 8/1996 | Leland |
| 5,548,605 A | 8/1996 | Benett et al. |
| 5,564,497 A | 10/1996 | Fukuoka et al. ............ 165/152 |
| 5,575,929 A | 11/1996 | Yu et al. |
| 5,585,069 A | 12/1996 | Zanzucchi et al. |
| 5,641,400 A | 6/1997 | Kaltenbach et al. |
| 5,658,831 A | 8/1997 | Layton et al. |
| 5,675,473 A | 10/1997 | McDunn et al. |
| 5,692,558 A | 12/1997 | Hamilton et al. |
| 5,696,405 A | 12/1997 | Weld |
| 5,727,618 A | 3/1998 | Mundinger et al. |
| 5,740,013 A | 4/1998 | Roesner et al. |
| 5,763,951 A | 6/1998 | Hamilton et al. |
| 5,768,104 A | 6/1998 | Salmonson et al. |
| 5,774,779 A | 6/1998 | Tuchinskiy |
| 5,800,690 A | 9/1998 | Chow et al. |
| 5,801,442 A | 9/1998 | Hamilton et al. |
| 5,810,077 A | 9/1998 | Nakamura et al. .......... 165/153 |
| 5,835,345 A | 11/1998 | Staskus et al. |
| 5,858,188 A | 1/1999 | Soane et al. |
| 5,863,708 A | 1/1999 | Zanzucchi et al. |
| 5,870,823 A | 2/1999 | Bezama et al. |
| 5,874,795 A | 2/1999 | Sakamoto |
| 5,880,524 A | 3/1999 | Xie |
| 5,886,870 A | 3/1999 | Omori |
| 5,901,037 A | 5/1999 | Hamilton et al. |
| 5,921,087 A | 7/1999 | Bhatia et al. |
| 5,936,192 A | 8/1999 | Tauchi |
| 5,945,217 A | 8/1999 | Hanrahan |
| 5,964,092 A | 10/1999 | Tozuka et al. |
| 5,965,001 A | 10/1999 | Chow et al. |
| 5,978,220 A | 11/1999 | Frey et al. |
| 5,993,750 A | 11/1999 | Ghosh et al. |
| 5,997,713 A | 12/1999 | Beetz, Jr. et al. |
| 5,998,240 A | 12/1999 | Hamilton et al. |
| 6,007,309 A | 12/1999 | Hartley |
| 6,014,312 A | 1/2000 | Schulz-Harder et al. |
| 6,019,165 A | 2/2000 | Batchelder |
| 6,021,045 A | 2/2000 | Johnson |
| 6,034,872 A | 3/2000 | Chrysler et al. |
| 6,039,114 A | 3/2000 | Becker et al. |
| 6,054,034 A | 4/2000 | Soane et al. |
| 6,068,752 A | 5/2000 | Dubrow et al. |
| 6,090,251 A | 7/2000 | Sundberg et al. |
| 6,096,656 A | 8/2000 | Matzke et al. |
| 6,100,541 A | 8/2000 | Nagle et al. |
| 6,101,715 A | 8/2000 | Fuesser et al. |
| 6,119,729 A | 9/2000 | Oberholzer et al. |
| 6,126,723 A | 10/2000 | Drost et al. |
| 6,129,145 A | 10/2000 | Yamamoto et al. |
| 6,129,260 A | 10/2000 | Andrus et al. |
| 6,131,650 A * | 10/2000 | North et al. ............... 165/170 |
| 6,140,860 A | 10/2000 | Sandhu et al. |
| 6,146,103 A | 11/2000 | Lee et al. |
| 6,159,353 A | 12/2000 | West et al. |
| 6,167,948 B1 | 1/2001 | Thomas |
| 6,174,675 B1 | 1/2001 | Chow et al. |
| 6,176,962 B1 | 1/2001 | Soane et al. |
| 6,186,660 B1 | 2/2001 | Kopf-Sill et al. |
| 6,196,307 B1 * | 3/2001 | Ozmat ....................... 165/185 |
| 6,206,022 B1 | 3/2001 | Tsai et al. |
| 6,210,986 B1 | 4/2001 | Arnold et al. |
| 6,216,343 B1 | 4/2001 | Leland et al. |
| 6,221,226 B1 | 4/2001 | Kopf-Sill |
| 6,234,240 B1 | 5/2001 | Cheon |
| 6,238,538 B1 | 5/2001 | Parce et al. |
| 6,253,832 B1 | 7/2001 | Hallefalt |
| 6,253,835 B1 | 7/2001 | Chu et al. |
| 6,257,320 B1 | 7/2001 | Wargo |
| 6,301,109 B1 | 10/2001 | Chu et al. |

| | | |
|---|---|---|
| 6,313,992 B1 | 11/2001 | Hildebrandt |
| 6,317,326 B1 | 11/2001 | Vogel et al. |
| 6,321,791 B1 | 11/2001 | Chow |
| 6,322,753 B1 | 11/2001 | Lindberg et al. |
| 6,324,058 B1 | 11/2001 | Hsiao |
| 6,330,907 B1 | 12/2001 | Ogushi et al. |
| 6,336,497 B1 | 1/2002 | Lin |
| 6,337,794 B1 | 1/2002 | Agonafer et al. |
| 6,347,036 B1 | 2/2002 | Yeager et al. |
| 6,351,384 B1 | 2/2002 | Daikoku et al. |
| 6,366,462 B1 | 4/2002 | Chu et al. |
| 6,366,467 B1 | 4/2002 | Patel et al. |
| 6,367,544 B1 | 4/2002 | Calaman |
| 6,388,317 B1 | 5/2002 | Reese |
| 6,396,706 B1 | 5/2002 | Wohlfarth |
| 6,397,932 B1 | 6/2002 | Calaman et al. |
| 6,400,012 B1 | 6/2002 | Miller et al. |
| 6,406,605 B1 | 6/2002 | Moles |
| 6,415,860 B1 | 7/2002 | Kelly et al. |
| 6,417,060 B2 | 7/2002 | Tavkhelidze et al. |
| 6,424,531 B1 | 7/2002 | Bhatti et al. |
| 6,431,260 B1 | 8/2002 | Agonafer et al. |
| 6,437,981 B1 | 8/2002 | Newton et al. |
| 6,438,984 B1 | 8/2002 | Novotny et al. |
| 6,443,222 B1 | 9/2002 | Yun et al. |
| 6,444,461 B1 | 9/2002 | Knapp et al. |
| 6,449,157 B1 | 9/2002 | Chu |
| 6,449,162 B1 | 9/2002 | Corbin, Jr. et al. |
| 6,457,515 B1 | 10/2002 | Vafai et al. |
| 6,459,581 B1 | 10/2002 | Newton et al. |
| 6,459,582 B1 | 10/2002 | Ali et al. |
| 6,466,442 B2 | 10/2002 | Lin |
| 6,477,045 B1 | 11/2002 | Wang |
| 6,492,200 B1 | 12/2002 | Park et al. |
| 6,508,301 B2 * | 1/2003 | Marsala ............ 165/80.4 |
| 6,519,151 B2 | 2/2003 | Chu et al. |
| 6,533,029 B1 | 3/2003 | Phillips |
| 6,536,516 B2 | 3/2003 | Davies et al. |
| 6,537,437 B1 | 3/2003 | Galambos et al. |
| 6,543,521 B1 | 4/2003 | Sato et al. |
| 6,553,253 B1 | 4/2003 | Chang |
| 6,578,626 B1 | 6/2003 | Calaman et al. |
| 6,581,388 B2 | 6/2003 | Novotny et al. |
| 6,587,343 B2 | 7/2003 | Novotny et al. |
| 6,588,498 B1 | 7/2003 | Reyzin et al. |
| 6,591,625 B1 | 7/2003 | Simon |
| 6,600,220 B2 | 7/2003 | Barber et al. |
| 6,601,643 B2 | 8/2003 | Cho et al. |
| 6,606,251 B1 | 8/2003 | Kenny, Jr. et al. |
| 6,609,560 B2 | 8/2003 | Cho et al. |
| 6,632,655 B1 | 10/2003 | Mehta et al. |
| 6,632,719 B1 | 10/2003 | DeBoer et al. |
| 6,651,735 B2 | 11/2003 | Cho et al. |
| 6,729,383 B1 | 5/2004 | Cannell et al. |
| 6,743,664 B2 | 6/2004 | Liang et al. |
| 2001/0016985 A1 | 8/2001 | Insley et al. |
| 2001/0024820 A1 | 9/2001 | Mastromatteo et al. |
| 2001/0045270 A1 | 11/2001 | Bhatti |
| 2001/0046703 A1 | 11/2001 | Burns et al. |
| 2002/0075645 A1 | 6/2002 | Kitano et al. |
| 2002/0121105 A1 | 9/2002 | McCarthy, Jr. et al. |
| 2002/0134543 A1 | 9/2002 | Estes et al. |
| 2003/0062149 A1 | 4/2003 | Goodson et al. |
| 2003/0121274 A1 | 7/2003 | Wightman |
| 2003/0213580 A1 | 11/2003 | Philpott et al. |
| 2004/0040695 A1 | 3/2004 | Chesser et al. |
| 2004/0052049 A1 | 3/2004 | Wu et al. |
| 2004/0089008 A1 | 5/2004 | Tilton et al. |
| 2004/0112571 A1 * | 6/2004 | Kenny et al. ............ 165/80.3 |
| 2004/0125561 A1 | 7/2004 | Gwin et al. |
| 2004/0160741 A1 | 8/2004 | Moss et al. |
| 2004/0188069 A1 | 9/2004 | Tomioka et al. |
| 2005/0168949 A1 * | 8/2005 | Tilton et al. ............ 361/699 |

FOREIGN PATENT DOCUMENTS

| | | |
|---|---|---|
| DE | 197 10 716 C2 | 9/1998 |
| JP | 10-99592 | 4/1998 |
| JP | 2000-277540 | 10/2000 |
| JP | 2001-326311 | 11/2001 |
| WO | WO 01/25711 A1 | 4/2001 |

OTHER PUBLICATIONS

Kendra V. Sharp et al., "Liquid Flows in Microchannels", 2002, vol. 6, pp. 6-1 to 6-38.

Shuchi Shoji et al., "Microflow devices and systems", J. Micromech. Microeng. 4 (1994), pp. 157-171, printed in the U.K.

Angela Rasmussen et al., "Fabrication Techniques to Realize CMOS-Compatible Microfluidic Microchannels", Journal of Microelectromechanical Systems, Vo. 10, No. 2, Jun. 2001, pp. 286-297.

J. H. Wang et al., "Thermal-Hydraulic Characteristic of Micro Heat Exchangers", 1991, DSC-vol. 32, Micromechanical Sensors, Actuators, and Systems, pp. 331-339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing through Microchannels", Experimental Heat Transfer An International Journal, vol. 7, No. 4, Oct.-Dec. 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP-vol. 4-2, Advances in Electronic Packaging, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromachining", Sep. 1999, Microfluidic Devices and Systems II, vol. 3877, pp. 267-272.

G. Mohiuddin Mala et al., "Heat transfer and fluid flow in microchannels", 1997, Int. J. Heat Mass transfer, vol. 40, No. 13, pp. 3079-3088, printed in Great Britain.

J. M. Cuta et al., "Fabrication and Testing of Micro-Channel Heat Exchangers", SPIE vol. 2640, 1995, pp. 152-160.

Linan Jiang et al., "A Micro-Channel Heat Sink with Integrated Temperature Sensors for Phase Transition Study", IEEE 1999, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Bowers et al., "High flux boiling in low flow rate, low pressure drop mini-channel and micro-channel heat sinks", 1994, Int. J. Heat Mass Transfer, vol. 37, No. 2, pp. 321-332.

Yogendra Joshi, "Heat out of small packages", Dec. 2001, Mechanical Engineering, pp. 56-58.

A. Rostami et al., "Liquid Flow and Heat Transfer in Microchannels: A Review", 2000, Heat and Technology, vol. 18, No. 2, pp. 59-68.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchangers Fabricated in Silicon", 1996, HTD-vol. 331, National Heat Transfer Conference, vol. 9, pp. 131-136.

E. W. Kreutz et al., "Simulation of micro-channel heat sinks for optoelectronic microsystems", Microelectronics Journal 31 (2000), pp. 787-790.

J. C. Y. Koh et al., "Heat Transfer of Microstructures for Integrated Circuits", 1986, Int. Comm. Heat Mass Transfer, vol. 13, pp. 89-98.

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", Dec. 1995, IEEE Transactions on Components, Packaging, and Manufacturing Technology-Part A, vol. 18, No. 4, pp. 795-804.

Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.

Shung-Wen Kang et al., "The Performance Test and Analysis of Silicon-Based Microchannel Heat Sink", Jul. 1999, Terahertz and Gigahertz Photonics, vol. 3795, pp. 259-270.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloids and Surfaces A: Physicochemical and Engineering Aspects 161 (2000), pp. 89-102.

Jeffery D. Barner et al., "Thermal Ink Jet Print Head Carriage with Integral Liquid Cooling Capabilities", Xerox Disclosure Journal-vol. 21, No. 1, Jan./Feb. 1996, pp. 33-34.

"Autonomous displacement of a solution in a microchannel by another solution", Research Disclosure, Jun. 2001, pp. 1046-1047.

John M. Waldvogel, "Aluminum Silicon Carbide Phase Change Heat Spreader", Motorola, Jun. 1999, Technical Developments, pp. 226-230.

James P. Slupe et al., "An idea for maintaining a stable thermal environment for electronic devices", Research Disclosure, Aug. 2001, pp. 1312.

John M. Waldvogel, "A Heat Transfer Enhancement Method for Forced Convection Bonded-Fin Heatsinks", Motorola, Dec. 1997, Technical Developments, pp. 158-159.

"Thin Heat Pipe for Cooling Components on Printed Circuit Boards", IBM Technical Disclosure Bulletin, vol. 34, No. 7B, Dec. 1991, pp. 321-322.

R. C. Chu et al., "Process for Nucleate Boiling Enhancement", IBM Technical Disclosure Bulletin, vol. 18, No. 7, Dec. 1975, pp. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, p. 1425.

"Enhanced Cooling of Thermal Conduction Module", IBM Technical Disclosure Bulletin, vol. 30, No. 5, Oct. 1987, p. 426.

"Heat Exchanger Modules for Data Processor with Valves Operated by Pressure from Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellows Providing Inlet, Outlet and Redundant Connections to Water-Cooled Element", IBM Technical Bulletin, vol. 30, No. 5, Oct. 1987, pp. 345-347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39-40.

"Chip Cooling Device", IBM Technical Disclosure Bulletin, vol. 30, No. 9, Feb. 1988, pp. 435-436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.

N. P. Bailey et al., "Cooling Device for Controlled Rectifier", IBM Technical Disclosure Bulletin, vol. 21, No. 11, Apr. 1979, pp. 4609-4610.

W. J. Kleinfelder et al., "Liquid-Filled Bellows Heat Sink", IBM Technical Disclosure Bulletin, vol. 21, No. 10, Mar. 1979, pp. 4125-4126.

R. P. Chrisfield et al., "Distributed Power/Thermal Control", IBM Technical Disclosure Bulletin, vol. 22, No. 3, Aug. 1979, pp. 1131-1132.

A. J. Arnold et al., "Heat Sink Design for Cooling Modules in a Forced Air Environment", IBM Technical Disclosure Bulletin, vol. 22, No. 6, Nov. 1979, pp. 2297-2298.

A. J. Arnold, "Structure for the Removal of Heat from an Integrated Circuit Module", IBM Technical Disclosure Bulletin, vol. 22, No. 6, Nov. 1979, pp. 2294-2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat-Pipe Vapor Cooling Etched Silicon Structure", IBM Technical Disclosure Bulletin, vol. 25, No. 8, Jan. 1983, pp. 4118-4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Critical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 01, Jan. 1995, pp. 55-56.

"Self-Contained Active Heat Dissipation Device", IBM Technical Disclosure Bulletin, vol. 39, No. 04, Apr. 1996, pp. 115-116.

C. J. Keller et al., "Jet Cooling Cup for Cooling Semiconductor Devices", IBM Technical Disclosure Bulletin, vol. 20, No. 9, Feb. 1978, pp. 3575-3576.

B. J. Ronkese, "Centerless Ceramic Package with Directly Connected Heat Sink", IBM Technical Disclosure Bulletin, vol. 20, No. 9, Feb. 1978, p. 3577-3578.

K. S. Sachar, "Liquid Jet Cooling of Integrated Circuit Chips", vol. 20, No. 9, Feb. 1978, pp. 3727-3728.

A. H. Johnson, "Device Cooling", IBM Technical Disclosure Bulletin, vol. 20, No. 10, Mar. 1978, pp. 3919-3920.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336-4337.

J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334-4335.

A. J. Arnold et al., "Electronic Packaging Structure", IBM Technical Disclosure Bulletin, vol. 20, No. 11B, Apr. 1978, pp. 4820-4822.

V. Y. Doo et al., "High Performance Package for Memory", IBM Technical Disclosure Bulletin, vol. 21, No. 2, Jul. 1978, pp. 585-586.

"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755-2756.

"Circuit Package with Circulating Boiling Liquid and Local Heat Exchanger to Limit Vapor in Coolant Outlet", IBM Technical Disclosure Bulletin, vol. 31, No. 12, May 1989, p. 34.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.

"TCM-Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, Apr. 1989, pp. 305-306.

"Water-Cooled Circuit Module with Grooves Forming Water Passages Near Heat-Producing Devices", IBM Technical Disclosure Bulletin, vol. 31, No. 12, May 1989, pp. 49-50.

"Cold Plate for Thermal Conduction Module with Only Peripheral Mounting Bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run-In Testing of Multi-Chip Modules", IBM Technical Disclosure Bulletin, vol. 32, No. 5A, Oct. 1989, p. 129-130.

"Means of Removing More Heat From a TCM (Or Other Liquid-Cooled Logic Package) By Reducing the Coolant Temperature", IBM Technical Disclosure Bulletin, vol. 32, No. 5A, Oct. 1989, pp. 153-154.

E. G. Loeffel et al., "Liquid Cooled Module with Compliant Membrane", IBM Technical Disclosure Bulletin, vol. 20, No. 2, Jul. 1977, pp. 673-674.

V. Y. Doo et al., "Method of Effective Cooling of a High Power Silicon Chip", IBM Technical Disclosure Bulletin, vol. 20, No. 4, Sep. 1977, p. 1436-1437.

V. Y. Doo et al., Semiconductor Chip Cooling Package, IBM Technical Disclosure Bulletin, vol. 20, No. 4, Sep. 1977, pp. 1440-1441.

"Heat Sink Fabrication Method", IBM Technical Disclosure Bulletin, vol. 27, No. 10A, Mar. 1985, p. 5656-5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, IEEE Micro Electro Mechanical Systems, pp. 362-367.

Jaisree Moorthy et al., "Active control of electroosmotic flow in microchannels using light", Jan. 26, 2001, Sensors and Actuators B 75, pp. 223-229.

Andreas Manz et al., "Electroosmotic pumping and electrophoretic separations for miniaturized chemical analysis systems", Sep. 16, 1994, J.Micromech. Microeng. 4 (1994), pp. 257-265, printed in the U.K.

E. B. Cummings et al., "Irrotationality of uniform electroosmosis", Sep. 1999, Part of the SPIE Conference on Microfluidic Devices and Systems II, SPIE vol. 3877, pp. 180-189.

Haim H. Bau, "Optimization of conduits' shape in micro heat exchangers", Dec. 10, 1997, International Journal of Heat and Mass Transfer 41 (1998), pp. 2717-2723.

V. K. Dwivedi et al., "Fabrication of very smooth walls and bottoms of silicon microchannels for heat dissipation of semiconductor devices", Jan. 25, 2000, Microelectronics Journal 31 (2000), pp. 405-410.

M. B. Bowers et al.,, "Two-Phase Electronic Cooling Using Mini-Channel and Micro-Channel Heat Sinks: Part 2-Flow Rate and Pressure Drop Constraints", Dec. 1994, Journal of Electronic Packaging, vol. 116, pp. 298-305.

Meint J. de Boer et al., "Micromachining of Buried Micro Channels in Silicon", Mar. 2000, Journal of Microelectromechanical systems, vol. 9, No. 1, pp. 94-103.

S.B. Choi et al., "Fluid Flow and Heat Transfer in Microtubes", 1991, DSC-vol. 32, Micromechanical sensors, Actuators, and Systems, ASME 1991, pp. 123-134.

S. F. Choquette, M. Faghri et al., "Optimum Design of Microchannel Heat Sinks", DSC-vol. 59, Microelectromechanical Systems (MEMS), ASME 1996, pp. 115-126.

David Copeland et al., "Manifold Microchannel Heat Sinks: Theory and Experiment", EEP-vol. 10-2, Advances in Electronic Packaging ASME, 1995, pp. 829-835.

J. M. Cuta et al., "Forced Convection Heat Transfer in Parallel Channel Array Microchannel Heat Exchanger", PID-vol. 2 / HTD-vol. 338, Advances in Energy efficiency, Heat/Mass Transfer Enhancement, ASME 1996, pp. 17-23.

K. Fushinobu et al., "Heat Generation and Transport in Sub-Micron Semiconductor Devices", HTD-vol. 253, Heat Transfer on the Microscale, ASME 1993, pp. 21-28.

Charlotte Gillot et al., "Integrated Micro Heat Sink for Power Multichip Module", IEEE Transactions on Industry Applications, vol. 36, No. 1, Jan./Feb. 2000, pp. 217-221.

John Goodling, "Microchannel heat exchanger—a review", SPIE vol. 1997 High Heat Flux Engineering II (1993), pp. 66-82.

Koichiro Kawano et al., "Micro Channel Heat Exhanger for Cooling Electrical Equipment", HTD-vol. 361-3/PID-vol. 3, Proceedings of the ASME Heat Transfer Division—vol. 3, ASME 1998, pp. 173-188.

Chad Harris et al., "Design and Fabrication of a Cross Flow Micro Heat Exchanger", Dec. 2000, Journal of Microelectromechanical Systems, vol. 9, No. 4, pp. 502-508.

George M. Harpole et al., "Micro-Channel Heat Exchanger Optimization", 1991, Seventh IEEE SEMI-THERM Symposium, pp. 59-63.

Pei-Xue Jiang et al., "Thermal-hydraulic performance of small scale micro-channel and porous-media heat-exchangers", International Journal of Heat and Mass Transfer 44 (2001), pp. 1039-1051.

X.N. Jiang et al., "Laminar Flow Through Microchannels Used for Microscale Cooling Systems", 1997, IEEE/CPMT Electronic Packaging Technology Conference, pp. 119-122.

David Bazeley Tuckerman, "Heat-Transfer Microstructures for Integrated Circuits", Feb. 1984, pp. ii-xix, pp. 1-141.

M Esashi, "Silicon micromachining for integrated microsystems", Vacuum/vol.47/No. 6-8/1996, pp. 469-474.

T.S. Ravigururajan et al., "Effects of Heat Flux on Two-Phase Flow Characteristics of Refrigerant Flows in a Micro-Channel Heat Exchanger", HTD-vol. 329, National Heat Transfer Conference, vol. 7, ASME 1996, pp. 167-178.

T.S. Ravigrururajan et al., "Single-Phase Flow Thermal Performance Characteristics of a Parallel Micro-Channel Heat Exchanger", HTD-vol. 329, National Heat Transfer Conference, vol. 7, ASME 1996, pp. 157-166.

T.S. Ravigururajan et al., "Liquid Flow Characteristics in a Diamond-Pattern Micro-Heat-Exchanger", DSC-vol. 59 Microelectromechanical Systems (MEMS), ASME 1996, pp. 159-166.

T.S. Ravigururajan, "Impact of Channel Geometry on Two-Phase Flow Heat Transfer Characteristics of Refrigerants in Microchannel Heat Exchangers", May 1998, Journal of Heat Transfer, vol. 120, pp. 485-491.

J. Pfahler et al., "Liquid Transport in Micron and Submicron Channels", Mar. 1990, Sensors and Actuators, A21-A23 (1990), pp. 431-434.

Kenneth Pettigrew et al., "Performance of a MEMS based Micro Capillary Pumped Loop for Chip-Level Temperature Control", 2001, The 14th IEEE International Conference on Micro Electro Mechanical Systems, pp. 427-430.

C. Perret et al., "Microchannel integrated heat sinks in silicon technology", The 1998 IEEE Industry Applications Conference, pp. 1051-1055.

X.F. Peng et al., "Convective heat transfer and flow friction for water flow in microchannel structures", 1996, Int. J. Heat Mass Transfer, vol. 39, No. 12, pp. 2599-2608, printed in Great Britain.

X.F. Peng et al., "Experimental investigation of heat transfer in flat plates with rectangular microchannels", 1994, Int. J. Heat Mass Transfer, vol. 38, No. 1, pp. 127-137, printed in Great Britain.

X.F. Peng et al., "Cooling Characteristics with Microchanneled Structures", 1994, Enhanced Heat Transfer, vol. 1, No. 4, pp. 315-326, printed in the United States of America.

X.F. Peng et al., "Enhancing the Critical Heat Flux Using Microchanneled Surfaces", 1998, Enhanced Heat Transfer, vol. 5, pp. 165-176, Printed in India.

Yoichi Murakami et al., "Parametric Optimization of Multichanneled Heat Sinks for VLSI Chip Cooling", Mar. 2001, IEEE Transactions on Components and Packaging Technologies, vol. 24, No. 1, pp. 2-9.

D. Mundinger et al., "High average power 2-D laser diode arrays on silicon microchannel coolers", CLEO '89/Friday Morning/404.

L.J. Missaggia et al., "Microchannel Heat Sinks for Two-Dimensional High-Power-Density Diode Laser Arrays", IEEE Journal of Quantum Electronics, vol. 25, No. 9, Sep. 1989, pp. 1988-1992.

M.J. Marongiu et al., "Enhancement of Multichip Modules (MCMs) Cooling by Incorporating MicroHeatPipes and Other High Thermal Conductivity Materials into Microchannel Heat Sinks", 1998, Electronic Components and Technology Conference, pp. 45-50.

C.R. Friedrich et al., "Micro heat exchangers fabricated by diamond machining", Jan. 1994, Precision Engineering, vol. 16, No. 1, pp. 56-59.

Mali Mahalingam, "Thermal Management in Semiconductor Device Packaging", Proceedings of the IEEE, vol. 73, No. 9, Sep. 1985, pp. 1396-1404.

T.M. Adams et al., "An experimental investigation of single-phase forced convection in microchannels", 1997, Int. J. Heat Mass Transfer, vol. 41, Nos. 6-7, pp. 851-857, Printed in Great Britain.

T.M. Adams et al., "Applicability of traditional turbulent single-phase forced convection correlations to non-circular microchannels", Int. J. Heat and Transfer 42 (1999), pp. 4411-4415.

Bassam Badran et al., "Experimental Results for Low-Temperature Silicon Micromachined Micro Heat Pipe Arrays Using Water and Methanol as Working Fluids", May 31, 1997, Experimental Heat Transfer, 10: pp. 253-272.

D. Jed Harrison et al., "Electroosmotic Pumping Within A Chemical Sensor System Integrated on Silicon", Session C9 Chemical Sensors and Systems for Liquids, Jun. 26, 1991, pp. 792-795.

Kurt Seiler et al., "Electroosmotic Pumping and Valveless Control of Fluid Flow within a Manifold of Capillaries on a Glass Chip", 1994, Analytical Chemistry, vol. 66, No. 20, Oct. 15, 1994, pp. 3485-3491.

Philip H. Paul et al., "Electrokinetic Generation of High Pressures Using Porous Microstructures", 1998, Micro-Total Analysis Systems, pp. 49-52.

Gh. Mohiuddin Mala et al., "Flow characteristics of water through a microchannel between two parallel plates with electrokinetic effects", Oct. 1997, Int. J. Heat and Fluid Flow, vol. 18, No. 5, pp. 489-496.

W.E. Morf et al., "Partial electroosmotic pumping in complex capillary systems Part 1: Principles and general theoretical appraoch", Oct. 16, 2000, Sensors and Actuators B 72 (2001), pp. 266-272.

M. Esashi, "Silicon micromachining and micromachines", Wear, vol. 168, No. 1-2, (1993), pp. 181-187.

Stephanus Buttgenbach et al., "Microflow devices for miniaturized chemical analysis systems", Nov. 1998, SPIE-Chemical Microsensors and Applications, vol. 3539, pp. 51-61.

Sarah Arulanandam et al., "Liquid transport in rectangular microchannels by electroosmotic pumping", Colloids and Surfaces A: Physicochemical and Engineering Aspects, vol. 161 (2000), pp. 89-102.

Linan Jiang et al., "Closed-Loop Electroosmotic Microchannel Cooling System for VLSI Circuits", Mechanical Engineering Dept. Stanford University, pp. 1-27.

Susan L. R. Barker et al., "Fabrication, Derivatization and Applications of Plastic Microfluidic Devices", Proceedings of SPIE, vol. 4205, 2001, pp. 112-118.

Timothy E. McKnight et al., "Electroosmotically Induced Hydraulic Pumping with Integrated Electrodes on Microfluidic Devices", Aug. 15, 2001, Anal. Chem., vol. 73, No. 16, pp. 4045-4049.

Chris Bourne, "Cool Chips plc Receives Nanotech Manufacturing Patent", Jul. 31, 2002, pp. 1-2.

Frank Wagner et al., "Electroosmotic Flow Control in Micro Channels Produced by Scanning Excimer Laser Ablation", Proceedings of SPIE vol. 4088, 2000, pp. 337-340.

H. A. Goodman, "Data Processor Cooling With Connection To Maintain Flow Through Standby Pump", Dec. 1983, IBM Technical Disclosure Bulletin, vol. 26, No. 7A, p. 3325.

"Electroerosion Micropump", May 1990, IBM Technical Disclosure Bulletin, vol. 32, No. 12, pp. 342-343.

Shulin Zeng et al., "Fabrication and Characterization of Electrokinetic Micro Pumps", 2000 Inter Society Conference on Thermal Phenomena, pp. 31-35.

A. Manz et al., "Integrated Electroosmotic Pumps and Flow Manifolds for Total Chemical Analysis Systems", 1991, Inter. Conf. on Solid-State Sensors and Actuators, pp. 939-941.

O. T. Guenat et al., "Partial electroosmotic pumping in complex capillary systems Part: 2 Fabrication and application of a micro total analysis system suited for continuous volumetric nanotitrations", Sensors and Actuators B 72 (2001) pp. 273-282.

J. G. Sunderland, "Electrokinetic dewatering and thickening. I. Introduction and historical review of electrokinetic applications", Feb. 1987, Journal of Applied Electrochemistry, vol. 17, No. 5, pp. 889-898.

J. C. Rife et al., "Acousto- and electroosmotic microfluidic controllers", Sep. 1998, Microfluidic Devices and Systems, vol. 3515, pp. 125-135.

Purnendu K Dasgupta et al., "Electroosmosis: A Reliable Fluid Propulsion System for Flow Injection Analysis", Jun. 1994, Anal. Chem., vol. 66, No. 11, pp. 1792-1798.

Ray Beach et al., "Modular Microchannel Cooled Heatsinks for High Average Power Laser Diode Arrays", Apr. 1992, IEEE Journal of Quantum Electronics, vol. 28, No. 4, pp. 966-976.

Roy W. Knight et al., "Optimal Thermal Design of Air cooled Forced Convection Finned Heat Sinks—Experimental Verification", Oct. 1992, IEEE Transactions on Components, Hybrids, and Manufacturing Technology, vol. 15, No. 5, pp. 754-760.

Y. Zhuang et al., "Experimental study on local heat transfer with liquid impingement flow in two-dimensional micro-channels", 1997, Int. J. Heat Mass Transfer, vol. 40, No. 17, pp. 4055-4059.

D. Yu et al., "An Experimental and Theoretical Investigation of Fluid Flow and Heat Transfer in Microtubes", 1995, ASME/JSME Thermal Engineering Conference, vol. 1, pp. 523-530.

Xiaoqing Yin et al., "Micro Heat Exchangers Consisting of Pin Arrays", Journal of Electronic Packaging, Mar. 1997, vol. 119, pp. 51-57.

X. Yin et al., "Uniform Channel Micro Heat Exchangers", Journal of Electronic Packaging, Jun. 1997, vol. 119, pp. 89-94.

Chun Yang et al., "Modeling forced liquid convection in rectangular microchannels with electrokinetic effects", International Journal of Heat and Mass Transfer 41 (1998), pp. 4229-4249.

Arel Weisberg et al., "Analysis of microchannels for integrated cooling", 1992, Int. J. Heat Mass Transfer, vol. 35, No. 10, pp. 2465-2473.

Roger S. Stanley et al., "Two-Phase Flow in Microchannels", 1997, DSC-vol. 62/HTD-vol. 354, MEMS, pp. 143-152.

B. X. Wang et al., "Experimental investigation on Liquid forced-convection heat transfer through microchannels", 1994, Int. J. Heat Mass Transfer, vol. 37, Suppl. 1, pp. 73-82.

Kambiz Vafai et al., "Analysis of two-layered micro-channel heat sink concept in electronic cooling", Int. J. Heat Mass Transfer, 42 (1999), pp. 2287-2297.

Gokturk Tunc et al., "Heat transfer in rectangular microchannels", Int. J. Heat Mass Transfer, 45 (2002), pp. 765-773.

D. B. Tuckerman et al., "High-Performance Heat Sinking for VLSI", May 1981, IEEE Electron Device Letters, vol. EDL-2, No. 5, pp. 126-129.

Bengt Sunden et al., "An Overview of Fabrication Methods and Fluid Flow and Heat Transfer Characteristics of Micro Channels", pp. 3-23.

David S. Shen et al., "Micro Heat Spreader Enhanced Heat Transfer in MCMs", 1995, IEEE Multi-Chip Module Conference, pp. 189-194.

S. Sasaki et al., "Optimal Structure for Microgrooved Cooling Fin for High-Power LSI Devices", Electronic Letters, Dec. 4, 1986, vol. 22, No. 25.

Vijay K. Samalam, "Convective Heat Transfer in Microchannels", 1989, Journal of Electronic Materials, vol. 18, No. 5, pp. 611-617.

Sanjay K. Roy et al., "A Very High Heat Flux Microchannel Heat Exchanger for Cooling of Semiconductor Laser Diode Arrays", May 1996, IEEE Transactions on components, packaging, and manufacturing technology-part B, vol. 19, No. 2, pp. 444-451.

Charlotte Gillot et al., "Integrated Single and Two-Phase Micro Heat Sinks Under IGBT Chips", IEEE Transactions on Components and Packaging Technology, vol. 22, No. 3, Sep. 1999, pp. 384-389.

A.L. Pascuzzo et al., "Integrated Circuit Module Package Cooling Structure", IBM, vol. 20, No. 10, Mar. 1978, pp. 3898-3899.

H. Krumm, "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

* cited by examiner

APPARATUS AND METHOD OF EFFICIENT FLUID DELIVERY FOR COOLING A HEAT PRODUCING DEVICE

RELATED APPLICATION

This Patent Application claims priority under 35 U.S.C. 119 (e) of the co-pending U.S. Provisional Patent Application, Ser. No. 60/577,262 filed Jun. 4, 2004, and entitled "MULTIPLE COOLING TECHNIQUES". The Provisional Patent Application, Ser. 60/577,262 filed Jun. 4, 2004, and entitled "MULTIPLE COOLING TECHNIQUES" is also hereby incorporated by reference.

FIELD OF THE INVENTION

The invention relates to a method and apparatus for cooling a heat producing device in general, and specifically, to a method and apparatus for efficient fluid delivery in cooling an electronic device with minimal pressure drop within the heat exchanger.

BACKGROUND OF THE INVENTION

Since their introduction in the early 1980s, microchannel heat sinks have shown much potential for high heat-flux cooling applications and have been used in the industry. However, existing microchannels include conventional parallel channel arrangements which are not well suited for cooling heat producing devices which have spatially-varying heat loads. Such heat producing devices have areas which produce more heat than others. These hotter areas are hereby designated as "hot spots" whereas the areas of the heat source which do not produce as much heat are hereby termed, "warm spots".

FIGS. 1A and 1B illustrate a side view and top view of a prior art heat exchanger 10 which is coupled to an electronic device 99, such as a microprocessor via a thermal interface material ("TIM") 98. As shown in FIGS. 1A and 1B, fluid generally flows from a single inlet port 12 and flows along the bottom surface 11 through the parallel microchannels 14, as shown by the arrows, and exits through the outlet port 16. The heat exchanger 10 cools the electronic device 99, the fluid flows from the inlet port 12 to the outlet port 16 in a uniform manner. In other words, the fluid flows substantially uniformly along the entire bottom surface 11 of the heat exchanger 10 and does not supply more fluid to areas in the bottom surface 11 which correspond with hot spots in the device 99. In addition, the temperature of liquid flowing from the inlet generally increases as it flows along the bottom surface 11 of the heat exchanger. Therefore, regions of the heat source 99 which are downstream or near the outlet port 16 are not supplied with cool fluid, but actually warmer fluid or two-phase fluid which has already been heated upstream. In effect, the heated fluid actually propagates the heat across the entire bottom surface 11 of the heat exchanger and region of the heat source 99, whereby hot fluid near the outlet port 16 becomes ineffective in cooling the heat source 99. This increase in heat can cause two-phase flow instabilities in which the boiling of fluid along the bottom surface 11 forces fluid away from the areas where the most heat is generated. In addition, the heat exchanger 10 having only one inlet 12 and one outlet 16 forces fluid to travel along the long parallel microchannels 14 in the bottom surface 11 for the entire length of the heat exchanger 10, thereby creating a large pressure drop due to the length the fluid must travel. The large pressure drop formed in the heat exchanger 10 makes pumping fluid to the heat exchanger 10 difficult and augments the instabilities.

FIG. 1C illustrates a side view diagram of a prior art multi-level heat exchanger 20. Fluid enters the multi-level heat exchanger 20 through the port 22 and travels downward through multiple jets 28 in the middle layer 26 to the bottom surface 27 and out port 24. In addition, the fluid traveling along the jets 28 does not uniformly flow down to the bottom surface 27. In addition, the heat exchanger in FIG. 1C exhibits the same problems discussed above with regard to the heat exchanger 10 in FIGS. 1A and 1B.

What is needed is a heat exchanger which is configured to achieve a small pressure drop between the inlet and outlet fluid ports while efficiently cooling the heat source. What is also needed is a heat exchanger which is configured to achieve proper temperature uniformity in light of hot spots in the heat source.

SUMMARY OF THE INVENTION

In accordance with one embodiment of the present invention, a heat exchanger is disclosed. The heat exchanger comprises an interface layer in which heat is transferred from a heat source having a surface to a fluid. The heat exchanger also includes a manifold layer coupled to the interface layer. The manifold layer comprises a first set of fluid paths substantially perpendicular to the surface for directing the fluid to the interface layer; and a second set of fluid paths substantially parallel to the surface and perpendicular to the first set of fluid paths for removing the fluid from the interface layer.

The heat exchanger preferably includes an upper layer for circulating the fluid to and from the manifold layer. The upper layer can include a plurality of protruding features or a porous medium which improve flow control and also control freezing direction within the heat exchanger under conditions of fluid freezing. Preferably, the upper layer includes a central reservoir in which the fluid is delivered from an inlet port or ports of the heat exchanger. The heat exchanger preferably includes a porous copper structure disposed along the interface layer. The heat exchanger can include microchannels and/or micropins formed to channel fluid flow and promote heat transfer.

Preferably, the fluid is in single phase flow conditions. Alternatively, at least a portion of the fluid can be in two phase flow conditions. In another embodiment, at least a portion of the fluid can undergo a transition between single and two phase flow conditions in the heat exchanger.

Preferably, each fluid path is positioned to cool at least one interface hot spot region in the heat source. Preferably, the interface layer is coupled to the heat source. Alternatively, the interface layer is integrally formed to the heat source. The heat source can be an integrated circuit.

In another embodiment of the present invention, a heat exchanger is disclosed. The heat exchanger includes an interface layer in which heat is transferred from a heat source having a surface to a fluid. The heat exchanger also includes a manifold layer coupled to the interface layer. The manifold layer further comprises a first set of fluid paths substantially perpendicular to the surface for directing the fluid to the interface layer and a second set of fluid paths substantially parallel to the surface and perpendicular to the first set of fluid paths for removing the fluid from the interface layer. The heat exchanger further comprises an upper layer for circulating the fluid to and from the manifold layer. The upper layer can include a plurality of protruding features which improve flow control within the heat exchanger.

In another embodiment of the present invention, a manifold layer is configured to direct fluid to and from an interface layer within a heat exchanger. The manifold layer comprises a first set of fluid paths substantially perpendicular to the interface layer for directing the fluid to the interface layer and a second set of fluid paths substantially parallel to the interface layer perpendicular to the first set of fluid paths for removing the fluid from the interface layer.

In another embodiment of the present invention, a method of cooling a heat source coupled to an interface layer of a heat exchanger is disclosed. The method comprises the steps of: circulating a fluid into a central reservoir; directing the fluid through a first set of fluid paths substantially perpendicular to the interface layer; and removing the fluid from the interface layer through a second set of fluid paths substantially parallel to the interface layer and perpendicular to the first set of fluid paths. The method can also include the step of providing an upper layer to circulate the fluid to and from each fluid path. The method can further include the step of coupling a plurality of protruding features to the upper layer to improve flow control within the heat exchanger.

Other features and advantages of the present invention will become apparent after reviewing the detailed description of the preferred and alternative embodiments set forth below.

DETAILED DESCRIPTION OF THE PRESENT INVENTION

Generally, the heat exchanger captures thermal energy generated from a heat source by passing fluid through selective areas of the interface layer which is preferably coupled to the heat source. In particular, the fluid is directed to specific areas in the interface layer to cool the hot spots and areas around the hot spots to generally create temperature uniformity across the heat source while maintaining a small pressure drop within the heat exchanger. As discussed in the different embodiments below, the heat exchanger utilizes a plurality of apertures, channels and/or fingers in the manifold layer as well as conduits in the intermediate layer to direct and circulate fluid to and from selected hot spot areas in the interface layer. Alternatively, the heat exchanger includes several ports which are specifically disposed in predetermined locations to directly deliver fluid to and remove fluid from the hot spots to effectively cool the heat source.

It should be noted that although the present invention is preferably described as a microchannel heat exchanger, the present invention can be used in other applications and is not limited to the discussion herein.

Figure 1A:
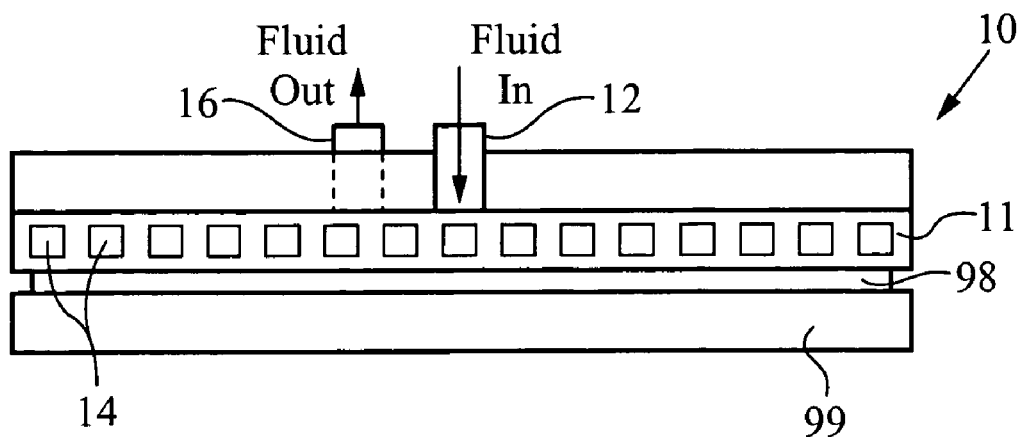
FIG. 1A illustrates a side view of a conventional heat exchanger.
Figure 1B:
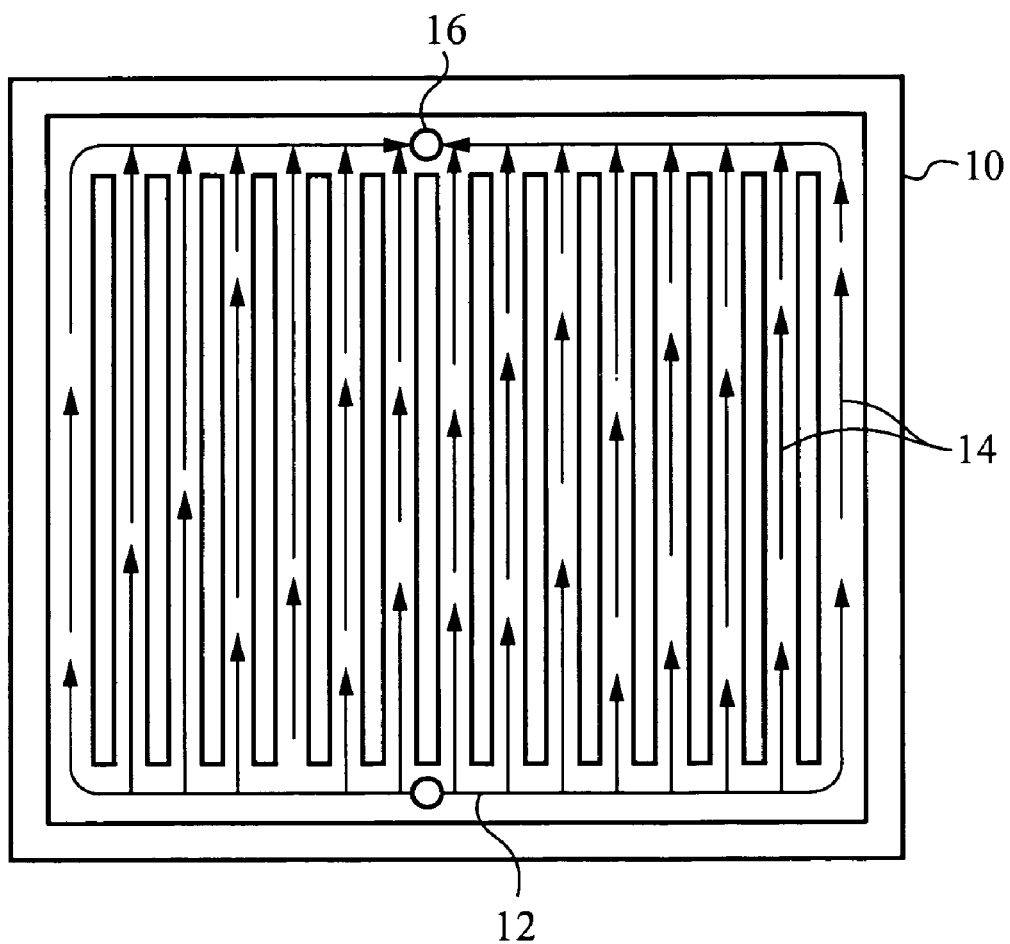
FIG. 1B illustrates a top view of the conventional heat exchanger.
Figure 1C:
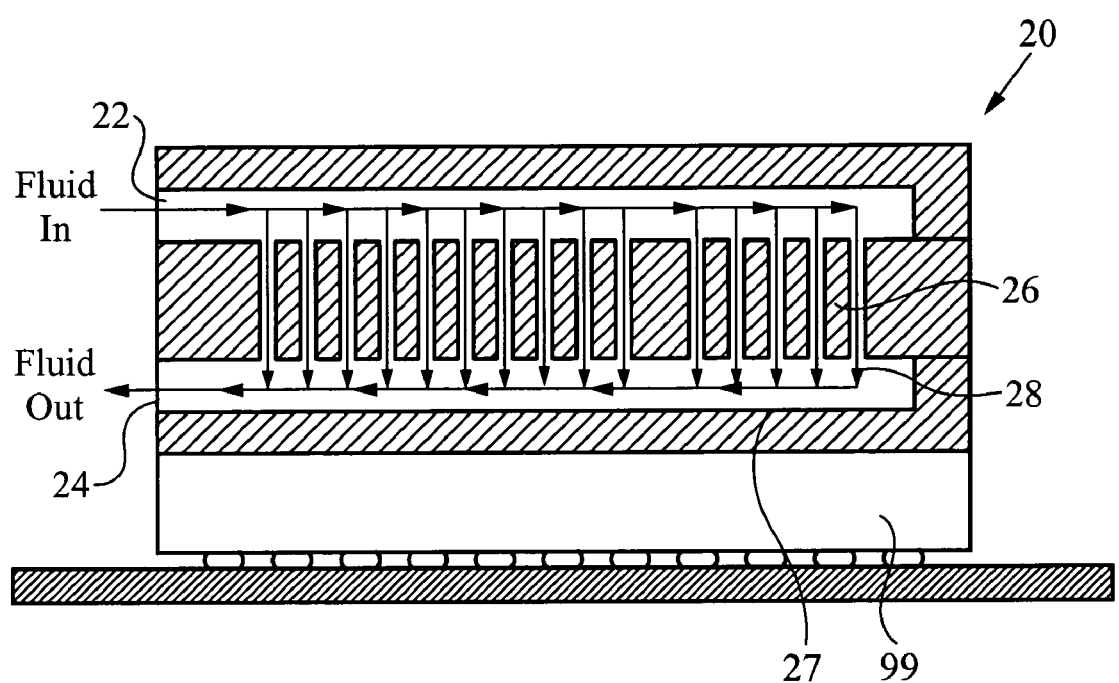
FIG. 1C illustrates a side view diagram of a prior art multi-level heat exchanger.
Figure 2:
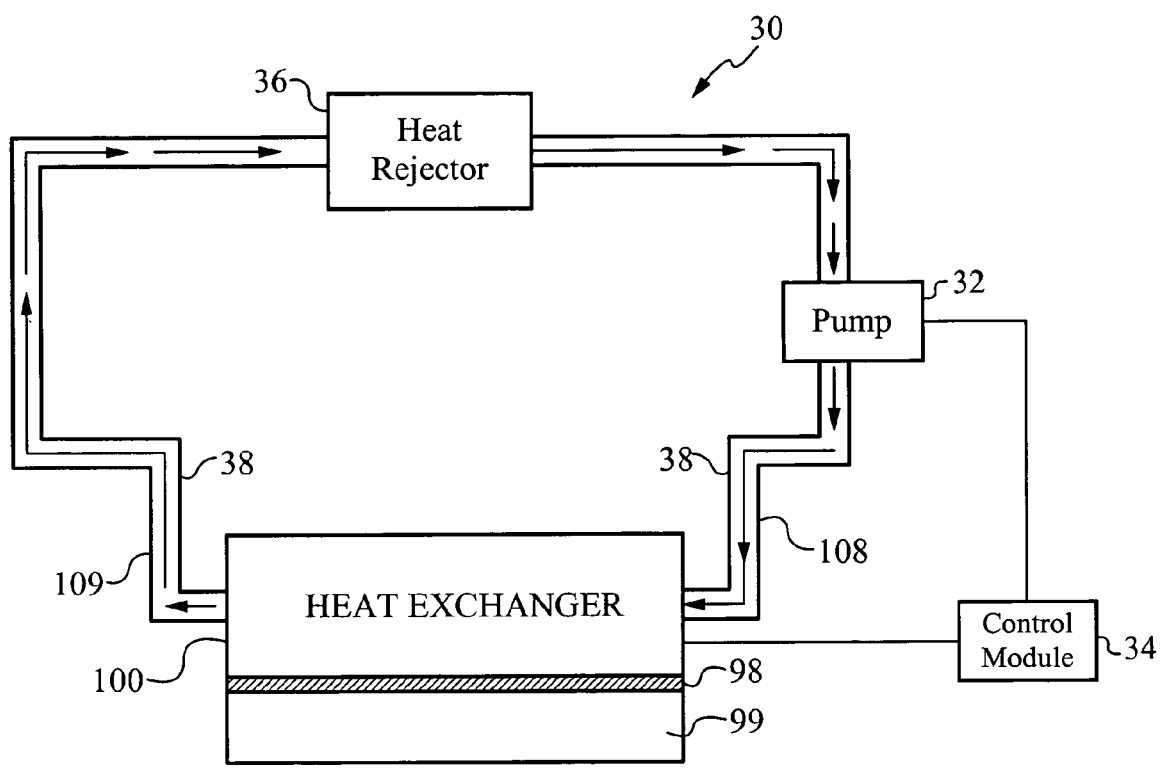
FIG. 2 illustrates a schematic diagram of a closed loop cooling system incorporating an embodiment of the heat exchanger of the present invention.

FIG. 2 illustrates a schematic diagram of a closed loop cooling system 30 which includes a flexible fluid delivery microchannel heat exchanger 100 in accordance with the present invention. As shown in FIG. 2, the fluid ports 108, 109 are coupled to fluid lines or tubular members 38 which are coupled to a pump 32 and heat rejector 36. The pump 32 pumps and circulates fluid within the closed loop 30. In one alternative, one fluid port 108 is used to supply fluid to the heat exchanger 100. In addition, one fluid port 109 is used to remove fluid from the heat exchanger 100. In one embodiment, a uniform, constant amount of fluid flow enters and exits the heat exchanger 100 via the respective fluid ports 108, 109. Alternatively, the amount of fluid flow through the inlet and outlet port(s) 108, 109 can vary with time.

As shown in FIG. 2, the heat exchanger 100 is coupled to a heat source 99, such as an electronic device, including, but not limited to a microchip and integrated circuit, whereby a thermal interface material 98 is preferably disposed between the heat source 99 and the heat exchanger 100. Alternatively, the heat exchanger 100 is directly coupled to the surface of the heat source 99. It is also apparent to one skilled in the art that the heat exchanger 100 is alternatively integrally formed into the heat source 99, whereby the heat exchanger 100 and the heat source 99 are formed as one piece.

It is preferred that the heat exchanger 100 of the present invention is configured to be directly or indirectly in contact with the heat source 99 which is rectangular in shape, as shown in the figures. However, it is apparent to one skilled in the art that the heat exchanger 100 can have any other shape conforming with the shape of the heat source 99. For example, the heat exchanger 100 of the present invention can be configured to have an outer semicircular shape (not shown) which allows the heat exchanger 100 to be in direct or indirect contact with a corresponding semicircular shaped heat source (not shown). In addition, it is preferred that the heat exchanger 100 is slightly larger in dimension than the heat source 99 within the range of and including 0.5–10.0 millimeters.

Figure 3:
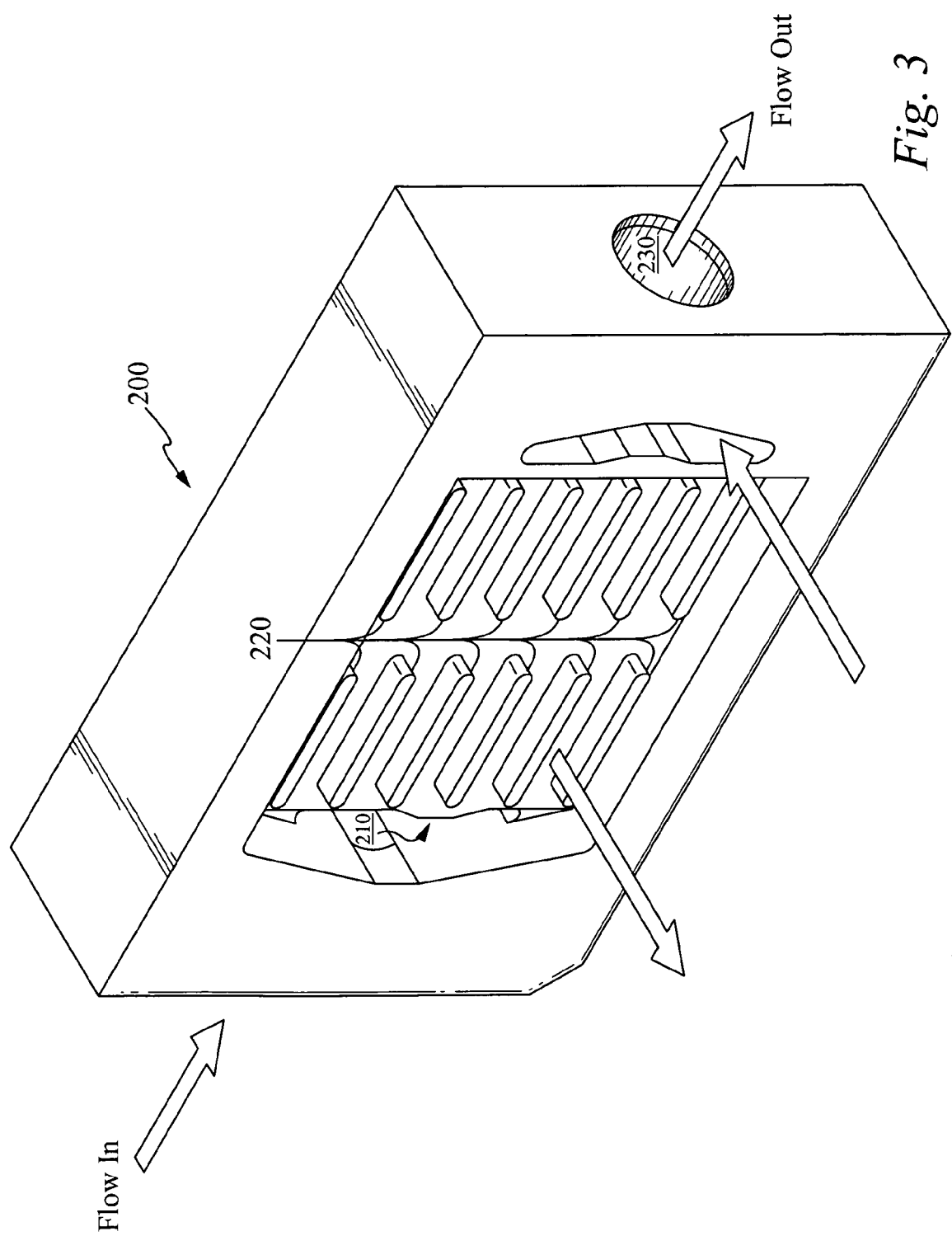
FIG. 3 illustrates a perspective view of the upper layer for circulating fluid to and from the manifold layer and which includes a plurality of protruding features for controlling freezing within the heat exchanger in accordance with one embodiment of the present invention.

FIG. 3 illustrates a perspective view of an upper layer 200 of the heat exchanger 100 (FIG. 2), in accordance with the present invention. The upper layer 200 circulates fluid to and from a manifold layer 350 (FIGS. 5–7) coupled to a reservoir 225 (FIG. 5) of the upper layer 200. The upper layer 200 houses an inlet port 210 and an outlet port 230. The inlet port 210 channels the fluid through the upper layer 200 from an inlet side of the tubular member (FIG. 2) of the system 30 (FIG. 2). The outlet port 230 channels the fluid away from an interface layer 400 (FIG. 5) and a copper foam (FIG. 5) to an outlet side of the tubular member 38 (FIG. 2).

Figure 4:
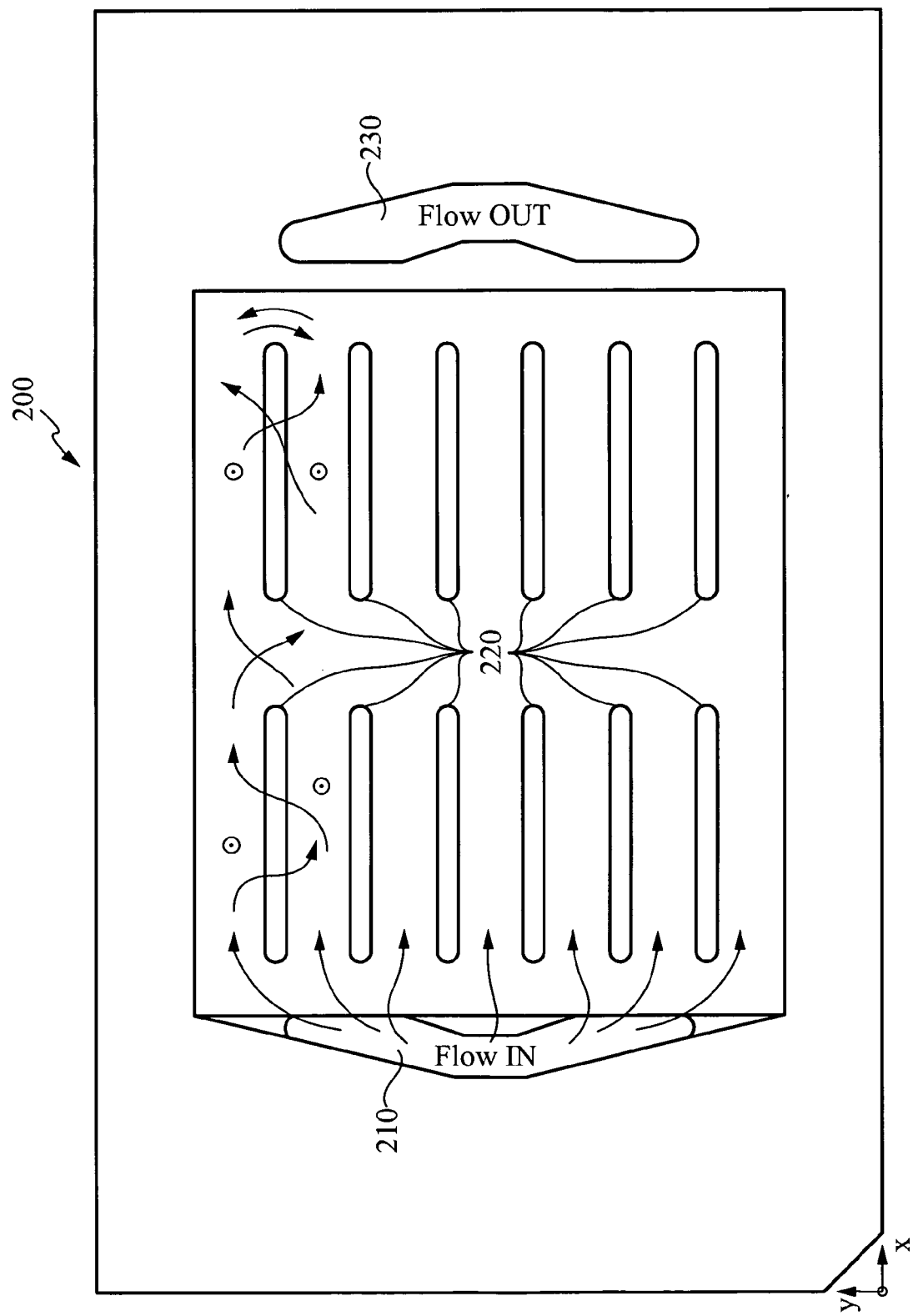
FIG. 4 illustrates a bottom view of the upper layer for circulating fluid to and from the manifold layer and which includes a plurality of protruding features for flow control within the heat exchanger, in accordance with one embodiment of the present invention.

FIG. 4 illustrates a bottom view of the upper layer 200 for circulating fluid to and from the manifold layer 350 (FIGS. 5–7) and which includes a plurality of protruding features 220 for controlling freezing within the heat exchanger 100 (FIG. 2) in accordance with one embodiment of the present invention. As shown, the inlet port 210 can include multiple inlet openings to channel the fluid through the upper layer 200 from an inlet side of the tubular member (FIG. 2) of the system 30 (FIG. 2). Similarly, the outlet port 230 can include multiple outlet openings to channel the fluid away from the upper layer 200 to an outlet side of the tubular member 38 (FIG. 2). The fluid circulates and travels around and under the features 220. The features 220 are not acting as flow direction channels.

In one embodiment, the upper layer 200 can include discrete structures. The discrete structures can be, partly or fully, a porous structure through which the fluid flows. Alternatively, the lid can be hollow.

Figure 5:
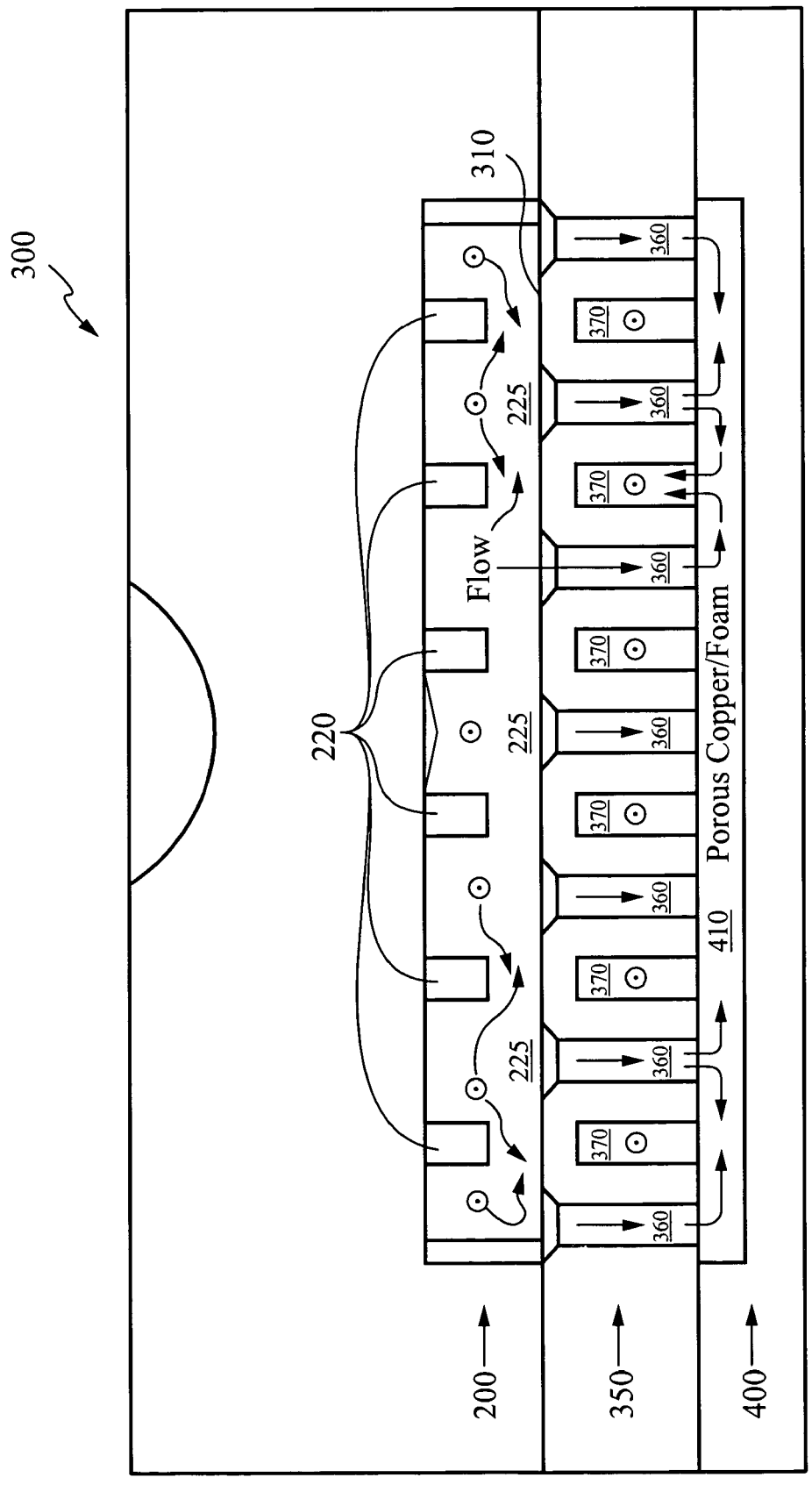
FIG. 5 illustrates a lateral cross-sectional view of the heat exchanger including the upper layer, the manifold layer and the interface layer in accordance with the present invention.

FIG. 5 illustrates a lateral cross-sectional view of a heat exchanger 300 including an upper layer 200 as described above, a manifold layer 350 and an interface layer 400, in accordance with the present invention. The upper layer 200 includes a plurality of optional protruding features 220 and a reservoir 225. The manifold layer 350 includes a plurality of inlet flow channels 360 and outlet flow channels 370. The interface layer 400 is preferably disposed between the heat source 99 (FIG. 2) and the manifold layer 350. The heat source 99 is preferably an integrated circuit. The interface layer 400 preferably includes a porous copper structure 410 disposed along a bottom surface of the interface layer 400. The upper layer 200, the manifold layer 350, and the interface layer 400 are preferably bonded together using a bonding technique (e.g., epoxy bonding, brazing, welding and soldering).

Still referring to FIG. 5, the fluid enters into the upper layer 200 via the inlet port 210 manifold layer 350 via the inlet flow channels 360, which include multiple openings and channels, and into the interface layer 400. The fluid then flows through apertures (not shown) of the porous copper structure 410 and exits out of the interface layer 400 and into and through the outlet flow channels 370, which also include multiple openings and channels, which have a flow direction perpendicular to the flow direction of the inlet flow channels 360. The fluid then flows out of the outlet flow channels 370 and back to the upper layer 200 to the outlet port 230 (FIGS. 3 and 4). The speed of the fluid through the porous copper structure 410 can be reduced by using multiple inlet openings and flow passages of the inlet flow channels 360 which reduces overall pressure drop for flow to occur through the porous copper structure 410 and provides efficient cooling of the integrated circuit. The inlet channels 360 are substantially normal to a surface of the integrated circuit while the outlet channels 370 are substantially parallel to the surface of the integrated circuit.

Figure 6:
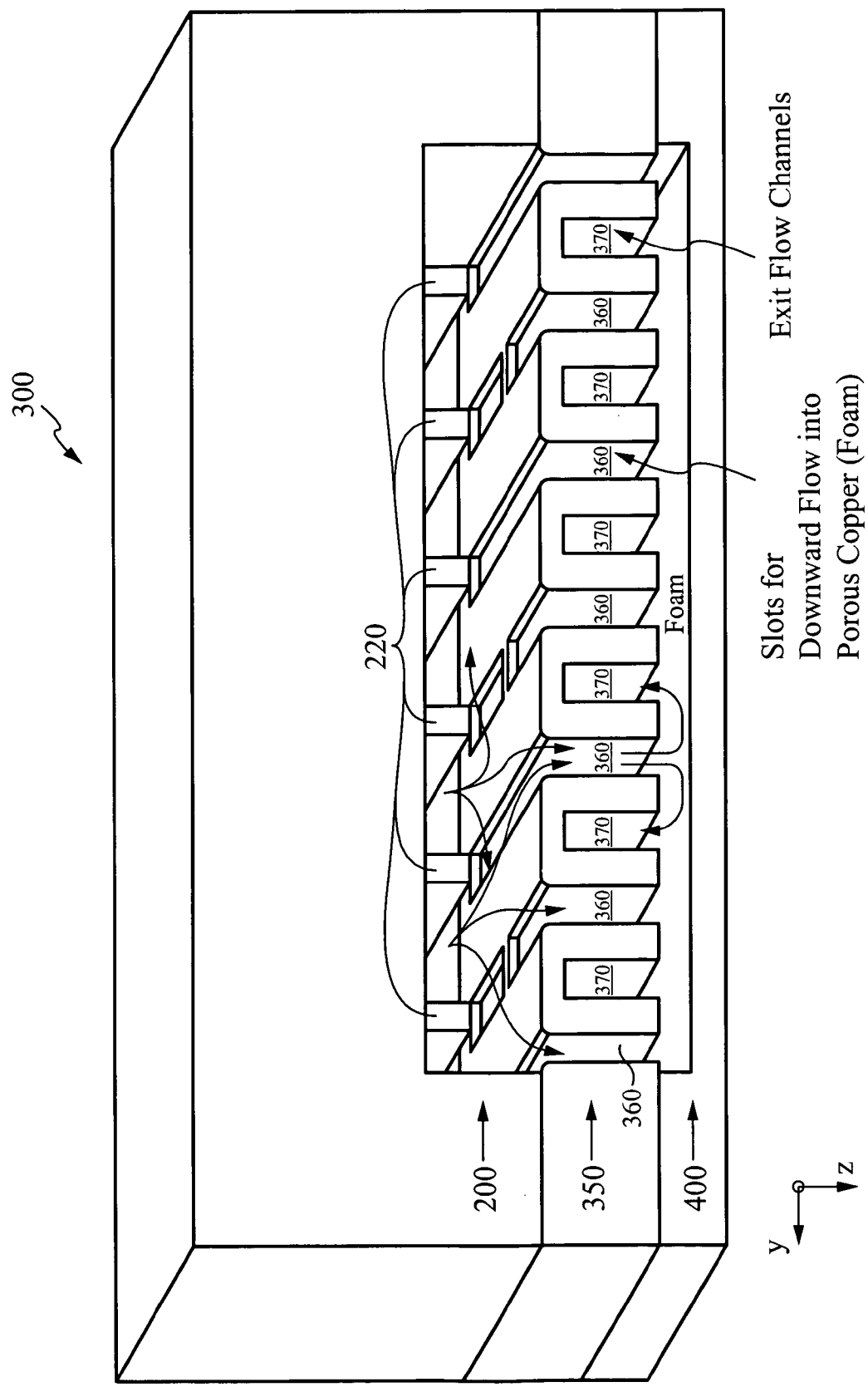
FIG. 6 illustrates an alternative lateral cross-sectional view of the heat exchanger including the upper layer, the manifold layer and the interface layer in accordance with the present invention.

FIG. 6 illustrates an alternative lateral cross-sectional view of the heat exchanger 300 including the upper layer 200, the manifold layer 350 and the interface layer 400 in accordance with the present invention. The upper layer 200 includes a plurality of protruding features 220. The cross-sectional view of FIG. 6 shows ends of half of the optional features 220. As mentioned above, the fluid flows around and under the optional features 220. The manifold layer 350 includes a plurality of inlet flow channels (inlet slots) 360 and outlet flow channels (outlet slots) 370. The inlet flow channels 360 are fluid paths which are substantially perpendicular to the heat source 99 (FIG. 2) for directing the fluid to the interface layer 400. The outlet flow channels 370 are fluid paths which are substantially parallel to the heat source 99 (FIG. 2) and perpendicular to the inlet flow channels 360. It will be appreciated that, in an alternative embodiment, fluid can flow in an opposite flow direction. The interface layer 400 is preferably disposed between the heat source 99 (FIG. 2) and the manifold layer 350. The interface layer 400 preferably includes a porous copper structure 410 disposed along a bottom surface of the interface layer 400. The inlet slots 360 allow for downward flow into the foam 410. The outlet slots 370 allow for exit flow out of the porous copper structure 410. The upper layer 200, the manifold layer 350, and the interface layer 400 are preferably bonded together using a bonding technique (e.g., epoxy bonding, brazing, welding, soldering or diffusion bonding).

Figure 7:
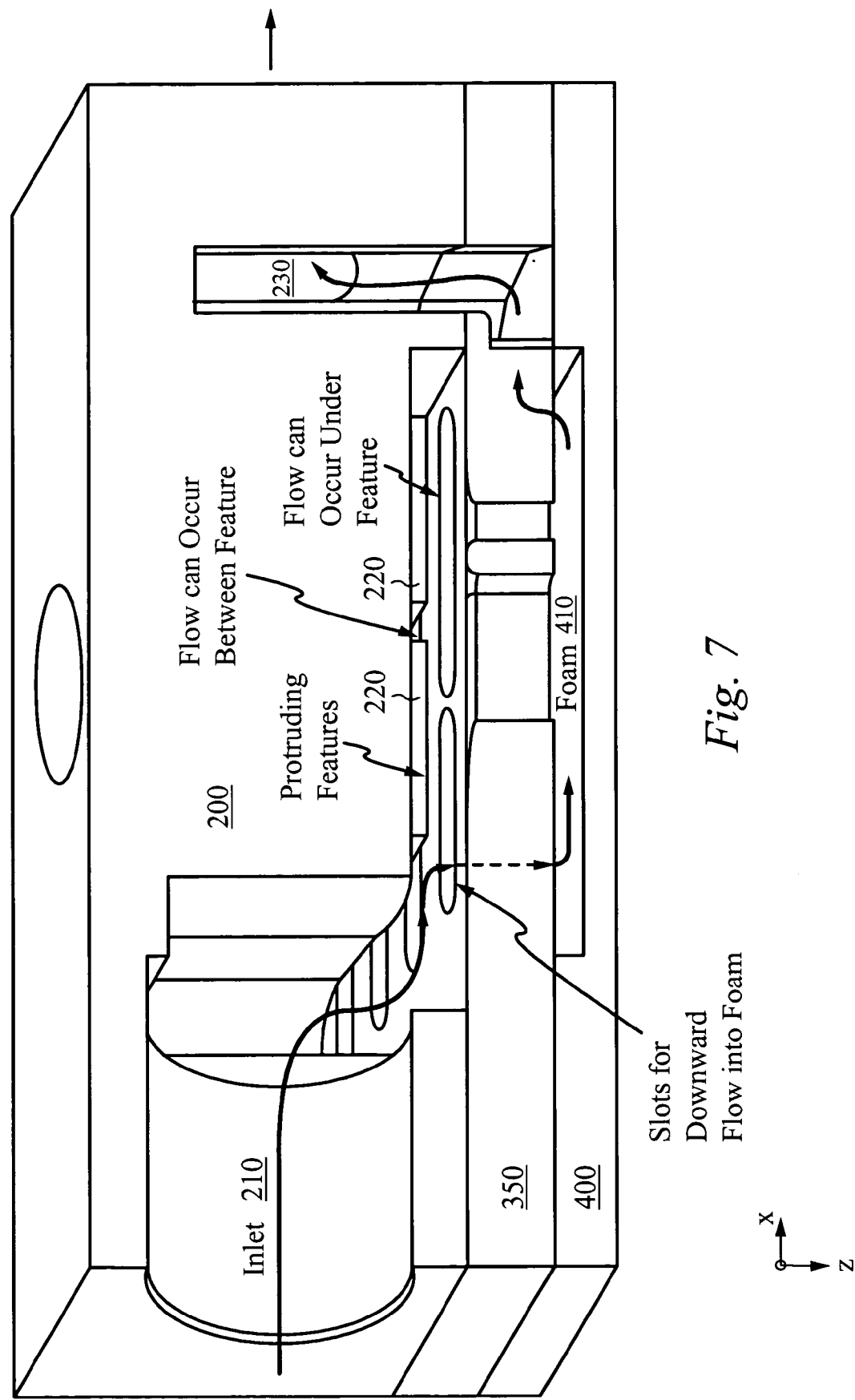
FIG. 7 illustrates a longitudinal cross-sectional view of the heat exchanger which shows a flow path from the inlet port to the outlet port in accordance with the present invention.

FIG. 7 illustrates a longitudinal cross-sectional view of a heat exchanger 300 which shows a flow path from the inlet port 210 to the outlet port 230 in accordance with the present invention. The heat exchanger 300 includes an upper layer 200, a manifold layer 350 and an interface layer 400. The upper layer 200 includes a plurality of optional protruding features 220. The fluid can flow between and under the optional features 220. The manifold layer in FIG. 7 shows a plurality of inlet slots for allowing downward flow into the interface layer 400. A porous copper structure 410 is disposed along a bottom surface of the interface layer 400. Alternatively, the interface layer 400 can include a plurality of microchannels (not shown) to channel fluid flow and promote heat transfer. In addition, the interface layer 400 can include a plurality of micropins (not shown) to channel fluid flow and promote heat transfer.

In the above embodiments, the fluid is in any of single phase flow (i.e., liquid), two phase flow (i.e., liquid/vapor mixture), or a transition between single and two phase flow. Single phase fluids is preferred. The system can be designed so that colder fluid is delivered at a high flow rate to hot spot regions of the interface layer 400 using the designs described above. For two phase fluids, such as a mixture of vapor and liquid, one method of effective cooling of the hot spots is to cause the fluid to boil at the hot spot to effectively cool the hot spot. It is well known that the temperature and boiling point of a two-phase fluid is directly proportional to the pressure of the fluid. In particular, as the amount of pressure in the fluid increases, the temperature and boiling point of the fluid increases. In contrast, as the amount of pressure decreases in the fluid, the temperature and boiling point of the fluid decreases. The heat exchanger 300 utilizes this pressure/temperature phenomenon of the fluid under single or two phase flow to effectively cool the hot spots and achieve temperature uniformity in the heat source 99 (FIG. 2).

For single phase flow, the heat exchanger 300 is configured to channel fluid that is a relatively low temperature to various parts of the interface layer 400 which is at a relatively higher temperature. The lower temperature fluid subjected to the hot spots will effectively cool the hot spots to a desired temperature while the higher temperature fluid will cool the warm or cold spots to the same desired temperature. In effect, the single phase flow achieves temperature uniformity in the heat source 99 (FIG. 2) by directing the fluid at the adequate temperature to the desired locations in the interface layer 400 to effectively cool the locations to a desired temperature.

For two phase flow, the heat exchanger 300 of the present invention is configured to channel fluid using a similar approach discussed above. In particular, the heat exchanger 300 of the present invention supplies lower pressure fluid to the hot spot regions of the interface layer 400 to purposely cause boiling at the hot spot regions. It is well known that boiling of a two phase fluid causes a significant pressure drop due to a substantial increase in acceleration of the two phase fluid. As stated above regarding the pressure-temperature relationship, a significant drop in fluid pressure will naturally cause the temperature to significantly drop to a temperature corresponding with the reduced pressure. Accordingly, the heat exchanger 300 is configurable to channel two phase fluid already at a relatively lower pressure to the interface hot spot regions. In addition, the heat exchanger 300 is configurable to channel fluid at a relatively higher pressure to cooler areas of the interface layer 400. The lower pressure fluid, upon coming into contact with the interface hot spot region, will significantly heat up and begin to boil at a much lower boiling point, thereby generating a pressure drop. As a result of the decrease in pressure, the temperature of the boiling two phase fluid effectively decreases. As a result, the two phase fluid becomes cooler and is able to more effectively cool the hot spot. It is apparent that the same theory applies in the reversing two phase fluid into single phase fluid to achieve temperature uniformity in the heat source 99 (FIG. 2).

The heat exchanger 300 of the present invention utilizes multiple fluid conditions to effectively achieve temperature uniformity in the heat source 99 (FIG. 2). The heat exchanger 300 is configurable to control the cooling effect of the fluid in each desired area by manipulating the fluid flow rate and/or the pressure of the fluid in the desired area using one pump 32 (FIG. 2). Alternatively, the heat exchanger 300 controls the cooling effect of the fluid in each desired area by manipulating the fluid flow rate and/or the pressure of the fluid in the desired area using multiple pumps.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A heat exchanger comprising:
   a. an interface layer in which heat is transferred from a heat source having a surface to a fluid; and
   b. a manifold layer coupled to the interface layer, the manifold layer further comprising:
      i. a first set of fluid paths substantially perpendicular to the surface for directing the fluid to the interface layer; and
      ii. a second set of fluid paths substantially parallel to the surface and perpendicular to the first set of fluid paths for removing the fluid from the interface layer.

2. The heat exchanger of claim 1 further including an upper layer for circulating the fluid to and from the manifold layer.

3. The heat exchanger of claim 2 wherein the upper layer includes a plurality of protruding features.

4. The heat exchanger of claim 2 wherein the upper layer includes a porous structure.

5. The heat exchanger of claim 2 wherein the upper layer includes a central reservoir in which the fluid is delivered from an inlet port of the heat exchanger.

6. The heat exchanger of claim 1 wherein the fluid is in single phase flow conditions.

7. The heat exchanger of claim 6 wherein at least a portion of the fluid is in two phase flow conditions.

8. The heat exchanger of claim 7 wherein at least a portion of the fluid undergoes a transition between single and two phase flow conditions in the heat exchanger.

9. The heat exchanger of claim 1 wherein each fluid path is positioned to cool at least one interface hot spot region in the heat source.

10. The heat exchanger of claim 1 wherein the interface layer is coupled to the heat source.

11. The heat exchanger of claim 1 wherein the interface layer is integrally formed to the heat source.

12. The heat exchanger of claim 1 wherein the heat source is an integrated circuit.

13. The heat exchanger of claim 1 further including a porous structure disposed along the interface layer.

14. The heat exchanger of claim 1 further including a plurality of microchannels formed to channel fluid flow and promote heat transfer.

15. The heat exchanger of claim 1 further including a plurality of micropins disposed along the interface layer.

16. A heat exchanger comprising:
   a. an interface layer in which heat is transferred from a heat source having a surface to a fluid;
   b. a manifold layer coupled to the interface layer, the manifold layer further comprising:
      i. a first set of fluid paths substantially perpendicular to the surface for directing the fluid to the interface layer; and
      ii. a second set of fluid paths substantially parallel to the surface and perpendicular to the first set of fluid paths for removing the fluid from the interface layer; and
   c. an upper layer for circulating the fluid to and from the manifold layer.

17. The heat exchanger of claim 16 wherein the upper layer includes a plurality of protruding features.

18. The heat exchanger of claim 16 wherein the upper layer includes a porous structure.

19. The heat exchanger of claim 16 wherein the upper layer includes a central reservoir in which the fluid is delivered from an inlet port of the heat exchanger.

20. The heat exchanger of claim 16 wherein the fluid is in single phase flow conditions.

21. The heat exchanger of claim 20 wherein at least a portion of the fluid is in two phase flow conditions.

22. The heat exchanger of claim 21 wherein at least a portion of the fluid undergoes a transition between single and two phase flow conditions in the heat exchanger.

23. The heat exchanger of claim 16 wherein each fluid path is positioned to cool at least one interface hot spot regions in the heat source.

24. The heat exchanger of claim 16 wherein the interface layer is coupled to the heat source.

25. The heat exchanger of claim 16 wherein the interface layer is integrally formed to the heat source.

26. The heat exchanger of claim 16 wherein the heat source is an integrated circuit.

27. The heat exchanger of claim 16 further including a porous structure disposed along the interface layer.

28. The heat exchanger of claim 16 further including a plurality of microchannels formed to channel fluid flow and promote heat transfer.

29. The heat exchanger of claim 16 further including a plurality of micropins disposed along the interface layer.

30. A manifold layer configured to direct fluid to and from an interface layer within a heat exchanger, the manifold layer comprising:
  a. a first set of fluid paths substantially perpendicular to the interface layer for directing the fluid to the interface layer; and
  b. a second set of fluid paths substantially parallel to the interface layer and perpendicular to the first set of fluid paths for removing the fluid from the interface layer.

31. The manifold layer of claim 30 wherein the manifold layer is coupled to an upper layer which circulates the fluid to and from the manifold layer, the upper layer including a central reservoir in which the fluid is delivered from an inlet port of the heat exchanger.

32. The manifold layer of claim 30 wherein the interface layer is coupled to a heat source.

33. The manifold layer of claim 30 wherein the fluid is in single phase flow conditions.

34. The manifold layer of claim 33 wherein at least a portion of the fluid is in two phase flow conditions.

35. The manifold layer of claim 34 wherein at least a portion of the fluid undergoes a transition between single and two phase flow conditions in the heat exchanger.

36. The manifold layer of claim 32 wherein each fluid path is positioned to cool at least one interface hot spot region in the heat source.

37. The manifold layer of claim 32 wherein the interface layer is integrally formed to the heat source.

38. The manifold layer of claim 32 wherein the heat source is an integrated circuit.

39. The manifold layer of claim 30 further including a porous structure disposed along the interface layer.

40. The manifold layer of claim 30 further including a plurality of microchannels formed to channel fluid flow and promote heat transfer.

41. A method of cooling a heat source coupled to an interface layer of a heat exchanger, the method comprising the steps of:
  a. circulating a fluid into a central reservoir;
  b. directing the fluid through a first set of fluid paths substantially perpendicular to the interface layer; and
  c. removing the fluid from the interface layer through a second set of fluid paths substantially parallel to the interface layer and perpendicular to the first set of fluid paths.

42. The method of claim 41 further including the step of providing an upper layer to circulate the fluid to and from each fluid path.

43. The method of claim 42 further including the step of coupling a plurality of protruding features to the upper layer.

44. The method of claim 42 further including the step of coupling a porous structure to the upper layer.

45. The method of claim 43 wherein the upper layer includes a central reservoir in which the fluid is delivered from an inlet port of the heat exchanger.

46. The method of claim 41 wherein the fluid is in single phase flow conditions.

47. The method of claim 46 wherein at least a portion of the fluid is in two phase flow conditions.

48. The method of claim 47 wherein at least a portion of the fluid undergoes a transition between single and two phase flow conditions in the heat exchanger.

49. The method of claim 41 wherein each fluid path is positioned to cool at least one interface hot spot region in the heat source.

50. The method of claim 41 wherein the interface layer is integrally formed to the heat source.

51. The method of claim 41 wherein the heat source is an integrated circuit.

52. The method of claim 41 wherein the interface layer includes a porous copper foam disposed along the interface layer.

53. The method of claim 41 wherein the interface layer includes a plurality of microchannels formed to channel fluid flow and promote heat transfer.

54. The method of claim 41 wherein the interface layer includes a plurality of micropins disposed along the interface layer.

* * * * *

UNITED STATES PATENT AND TRADEMARK OFFICE
CERTIFICATE OF CORRECTION

| | | |
|---|---|---|
| PATENT NO. | : 7,188,662 B2 | Page 1 of 1 |
| APPLICATION NO. | : 11/049313 | |
| DATED | : March 13, 2007 | |
| INVENTOR(S) | : Richard Grant Brewer et al. | |

It is certified that error appears in the above-identified patent and that said Letters Patent is hereby corrected as shown below:

At col. 5, line 37, replace "layer 200 via the inlet port 210 manifold layer 350 via the" with --layer 200 via the inlet port 210 (Figures 3 and 4) and into the reservoir 225. The fluid then circulates down through the manifold layer 350 via the"--.

Signed and Sealed this

Eighth Day of May, 2007

JON W. DUDAS
*Director of the United States Patent and Trademark Office*